United States Patent
Figuet et al.

(10) Patent No.: US 8,329,571 B2
(45) Date of Patent: *Dec. 11, 2012

(54) DEPOSITION METHODS FOR THE FORMATION OF III/V SEMICONDUCTOR MATERIALS, AND RELATED STRUCTURES

(75) Inventors: Christophe Figuet, Crolles (FR); Pierre Tomasini, Tempe, AZ (US)

(73) Assignee: Soitec, Bernin (FR)

( * ) Notice: Subject to any disclaimer, the term of this patent is extended or adjusted under 35 U.S.C. 154(b) by 0 days.

This patent is subject to a terminal disclaimer.

(21) Appl. No.: 13/371,710

(22) Filed: Feb. 13, 2012

(65) Prior Publication Data

US 2012/0225539 A1  Sep. 6, 2012

Related U.S. Application Data

(63) Continuation of application No. 13/038,920, filed on Mar. 2, 2011, now Pat. No. 8,148,252.

(51) Int. Cl.
*H01L 21/28* (2006.01)
(52) U.S. Cl. ............... 438/604; 438/761; 257/E21.097
(58) Field of Classification Search .............. 438/590, 438/602, 606; 257/E21.097, E21.326, E21.365, 257/E21.398, E21.459
See application file for complete search history.

(56) References Cited

U.S. PATENT DOCUMENTS

| 7,364,805 | B2 | 4/2008 | Morita et al. | |
| 7,727,331 | B2 | 6/2010 | Morita et al. | |
| 8,148,252 | B1 * | 4/2012 | Figuet et al. | 438/604 |
| 2007/0259502 | A1 | 11/2007 | Bour et al. | |
| 2008/0050889 | A1 | 2/2008 | Bour et al. | |
| 2009/0223442 | A1 | 9/2009 | Arena et al. | |
| 2010/0124814 | A1 | 5/2010 | Arena | |
| 2010/0265976 | A1 | 10/2010 | Bousquet et al. | |

FOREIGN PATENT DOCUMENTS

| JP | 2002217115 A | 8/2002 |
| WO | 02058120 A1 | 7/2002 |
| WO | 2010056952 A1 | 5/2010 |

OTHER PUBLICATIONS

Arena et al., Gas Injectors for CVD Systems with the Same, U.S. Appl. No. 61/157,112, filed Mar. 3, 2009.

Arena et al., Methods of Forming Bulk III-Nitride Materials on Metal-Nitride Growth Template Layers, and Structures Formed by Such Methods, U.S. Appl. No. 61/416,525, filed Nov. 23, 2010.

Bertram, Jr. Thermalizing Gas Injectors for Generating Increased Precursor Gas, Material Deposition Systems Including Such Injectors, and Related Methods, U.S. Appl. No. 12/894,724, filed Sep. 30, 2010.

(Continued)

*Primary Examiner* — Cheung Lee
(74) *Attorney, Agent, or Firm* — TraskBritt

(57) ABSTRACT

Methods of forming ternary III-nitride materials include epitaxially growing ternary III-nitride material on a substrate in a chamber. The epitaxial growth includes providing a precursor gas mixture within the chamber that includes a relatively high ratio of a partial pressure of a nitrogen precursor to a partial pressure of one or more Group III precursors in the chamber. Due at least in part to the relatively high ratio, a layer of ternary III-nitride material may be grown to a high final thickness with small V-pit defects therein. Semiconductor structures including such ternary III-nitride material layers are fabricated using such methods.

19 Claims, 5 Drawing Sheets

OTHER PUBLICATIONS

Hiramatsu et al., Fabrication and Characterization of Low Defect Density GaN Using Facet-Controlled Eptiaxial Lateral Overgrowth (FACELO), Journal of Crystal Growth (2002) vol. 221, pp. 316-326.
Holec et al., Critical Thickness Calculations for InGaN/Gan, Journal of Crystal Growth, vol. 303, No. 1, Jan. 25, 2007, pp. 314-317.
Huang et al., Strain Relief by Periodic Misfit Arrays for Low Defect Density, GaSb on GaAs, Applied Physics Letters (2006) vol. 88, 3 pages.
Miraglia et al., Helical-Type Surface Defects in InGaN Thin Films Epitaxially Grown on GaN Templates at Reduced Temperatures, Thin Solid Films, vol. 437, No. 1-2, Jun. 11, 2003, pp. 140-149.
Northrup et al., Surface Energetics, Pit Formation, and Chemical Ordering in InGaN Alloys, Applied Physics Letters, vol. 74, No. 16, Apr. 16, 1999, pp. 2319-2321.
Preliminary Search Report and Opinion for French Application No. FR 1152038 dated Jul. 26, 2011, 4 pages.
Singh et al., Phase Separation in InGaN Thick Films and Formation of InGaN/GaN Double Herterostructures in the Entire Alloy Compositions, Appl. Phys. Lett. vol. 90, No. 9, Mar. 3, 1997, pp. 1089-1091.

* cited by examiner

_US 8,329,571 B2_

DEPOSITION METHODS FOR THE FORMATION OF III/V SEMICONDUCTOR MATERIALS, AND RELATED STRUCTURES

CROSS-REFERENCE TO RELATED APPLICATION

This application is a continuation of U.S. patent application Ser. No. 13/038,920, filed March 2, 2011, now U.S. Pat. No. 8,148,252, issued Apr. 3, 2012, the disclosure of which is hereby incorporated herein by this reference in its entirety.

FIELD

Embodiments of the present disclosure generally relate to methods of forming III/V semiconductor materials, and to semiconductor structures fabricated using such methods.

BACKGROUND

III/V semiconductor materials, such as, for example, III-nitrides (e.g., indium gallium nitride (InGaN)), III-arsenides (e.g., indium gallium arsenide (InGaAs)), and III-phosphides (e.g., indium gallium phosphide (InGaP)), may be employed in various electronic, optical, and optoelectronic devices. Examples of such devices include switching structures (e.g., transistors, etc.), light-emitting structures (e.g., light-emitting diodes, laser diodes, etc.), and light-receiving structures (e.g., waveguides, splitters, mixers, photodiodes, solar cells, solar subcells etc.). Such devices containing III/V semiconductor materials may be used in a wide variety of applications. For example, such devices are often used to produce electromagnetic radiation (e.g., visible light) at one or more wavelengths. The electromagnetic radiation emitted by such devices may be utilized in, for example, media storage and retrieval applications, communications applications, printing applications, spectroscopy applications, biological agent detection applications, and image projection applications.

III/V semiconductor materials may be fabricated by depositing, or "growing," a layer of III/V semiconductor material on an underlying substrate. The layer of III/V semiconductor material, which is crystalline, may be substantially comprised of a single crystal of the III/V semiconductor material. The substrate is selected to have a crystal structure like that of the III/V semiconductor material to be grown thereon. The substrate may have a known, selected crystallographic orientation, such that the growth surface of the substrate on which the III/V semiconductor material is to be grown comprises a known crystallographic plane in the crystal structure of the substrate material. The crystalline III/V semiconductor material having a crystal structure like that of the substrate material then may be grown epitaxially on the underlying substrate. In other words, the crystal structure of the III/V semiconductor material may be aligned and oriented with the similar crystal structure of the underlying substrate. Although the crystal structure of the III/V semiconductor material may be similar to that of the underlying substrate, the spacing between the atoms in a given crystallographic plane within the crystal structure of the III/V semiconductor material may differ (in the relaxed, equilibrium state) from the spacing between the atoms in the corresponding crystallographic plane within the crystal structure of the underlying substrate. In other words, the relaxed lattice parameter of the III/V semiconductor material may differ from the relaxed lattice parameter of the underlying substrate material.

In greater detail, the III/V semiconductor material layer may initially grow "pseudomorphically" on the underlying substrate, such that the actual lattice parameter of the III/V semiconductor material is forced (e.g., by atomic forces) to substantially match the actual lattice parameter of the underlying substrate upon which it is grown. The lattice mismatch between the III/V semiconductor material and the underlying substrate may induce strain in the crystal lattice of the III/V semiconductor material, and the strain results in corresponding stress within the III/V semiconductor material. The stress energy stored within the III/V semiconductor material may increase as the thickness of the layer of the III/V semiconductor material grown over the substrate increases. If the layer of III/V semiconductor material is grown to a total thickness equivalent to, or beyond, a thickness commonly referred to as the "critical thickness," the III/V semiconductor material may undergo strain relaxation. Strain relaxation in the III/V semiconductor material may deteriorate the crystalline quality of the III/V semiconductor material. For example, defects such as dislocations may form in the crystal structure of the III/V semiconductor material, the exposed major surface of the layer of III/V semiconductor material may be roughened, and/or phases may segregate within the otherwise homogenous material, such that regions of inhomogeneity are observed within the layer of III/V semiconductor material.

In some cases, these defects in the III/V semiconductor material may render the III/V semiconductor material unsuitable for use in the ultimate operational device to be formed using the III/V semiconductor material. For example, such defects may result in electrical shorting across a P-N junction formed in such a III/V semiconductor material as part of a light-emitting diode (LED) or a laser diode, such that the P-N junction and the diode do not generate the desired electromagnetic radiation.

There is a need in the art for methods of forming III/V semiconductor materials that have smaller and/or reduced numbers of defects therein, and for semiconductor structures and devices that include such III/V semiconductor materials having smaller and/or reduced numbers of defects.

BRIEF SUMMARY

This summary is provided to introduce a selection of concepts in a simplified form that are further described in the detailed description below of some example embodiments of the disclosure. This summary is not intended to identify key features or essential features of the claimed subject matter, nor is it intended to be used to limit the scope of the claimed subject matter.

In some embodiments, the present disclosure includes methods of forming indium gallium nitride (InGaN). In accordance with such methods, a layer of gallium nitride (GaN) is provided within a chamber. A layer of InGaN is epitaxially grown on a surface of the layer of GaN. Epitaxial growth of the layer of InGaN includes providing a precursor gas mixture within the chamber, selecting the precursor gas mixture to comprise one or more Group III precursors and a nitrogen precursor, and formulating the precursor gas mixture to cause a ratio of a partial pressure of the nitrogen precursor to a partial pressure of the one or more Group III precursors within the chamber to be at least about 5,600. At least a portion of the one or more Group III precursors and at least a portion of the nitrogen precursor are decomposed proximate the surface of the layer of GaN to grow the layer of InGaN. The layer of InGaN is grown to an average final thickness greater than about one hundred nanometers (100 nm).

In additional embodiments, the present disclosure includes methods of forming a ternary III-nitride material comprising nitrogen, gallium, and at least one of indium and aluminum.

In accordance with such methods, a binary III-nitride material is provided within a chamber, and a layer of ternary III-nitride material is epitaxially grown on the binary III-nitride material. Epitaxial growth of the ternary III-nitride material includes providing a precursor gas mixture within the chamber that includes a nitrogen precursor and two or more Group III precursors, and formulating the precursor gas mixture such that a ratio of a partial pressure of the nitrogen precursor to a partial pressure of the one or more Group III precursors within the chamber is at least about 5,600. The nitrogen precursor and the two or more Group III precursors are decomposed in the chamber to form the layer of ternary III-nitride material. The layer of ternary III-nitride material is grown to an average final thickness greater than about one hundred nanometers (100 nm). The layer of ternary III-nitride material is formulated such that a relaxed lattice parameter mismatch between the layer of ternary III-nitride material and the binary III-nitride material is at least about 0.5% of the relaxed average lattice parameter of the binary III-nitride material. A plurality of V-pits are formed in the layer of ternary III-nitride material, and the V-pits are formed such that they have an average pit width of about two hundred nanometers (200 nm) or less in the fully grown layer of ternary III-nitride material.

The present disclosure also includes methods of forming a stack of layers of III-nitride material. In such methods, a substrate is provided within a chamber, and at least one layer of GaN and a plurality of layers of InGaN are epitaxially grown over the substrate within the chamber. The stack of layers of III-nitride material is formed to have a final average total thickness greater than about one hundred nanometers (100 nm). Additionally, epitaxial growth of at least one layer of InGaN of the plurality of layers of InGaN comprises providing a precursor gas mixture within the chamber, selecting the precursor gas mixture to comprise one or more Group III precursors and a nitrogen precursor, formulating the precursor gas mixture to cause a ratio of a partial pressure of the nitrogen precursor to a partial pressure of the one or more Group III precursors within the chamber to be at least about 5,600, and decomposing at least a portion of the one or more Group III precursors and at least a portion of the nitrogen precursor to form the at least one layer of InGaN.

In yet further embodiments, the present disclosure includes semiconductor structures fabricated using methods as disclosed herein. For example, in some embodiments, a semiconductor structure includes InGaN. The InGaN is formed by providing a layer of GaN within a chamber, and epitaxially growing a layer of InGaN on a surface of the layer of GaN. Epitaxial growth of the layer of InGaN includes providing a precursor gas mixture within the chamber, selecting the precursor gas mixture to comprise one or more Group III precursors and a nitrogen precursor, and formulating the precursor gas mixture to cause a ratio of a partial pressure of the nitrogen precursor to a partial pressure of the one or more Group III precursors within the chamber to be at least about 5,600. At least a portion of the one or more Group III precursors and at least a portion of the nitrogen precursor are decomposed proximate the surface of the layer of GaN to form the layer of InGaN. The fully grown layer of InGaN has an average final thickness greater than about one hundred nanometers (100 nm) and comprises a plurality of V-pits therein having an average pit width of about two hundred nanometers (200 nm) or less. Further, a relaxed lattice parameter mismatch between the fully grown layer of InGaN and the layer of GaN is at least about 0.5% of the relaxed average lattice parameter of the layer of GaN.

In additional embodiments, a semiconductor structure includes a ternary III-nitride material comprising nitrogen, gallium, and at least one of indium and aluminum. The ternary III-nitride material is formed by providing a substrate comprising a binary III-nitride material within a chamber, and epitaxially growing a layer of ternary III-nitride material on the binary III-nitride material. Epitaxial growth of the layer of ternary III-nitride material includes providing a precursor gas mixture within the chamber, wherein the precursor gas mixture includes a nitrogen precursor and two or more Group III precursors, and formulating the precursor gas mixture such that a ratio of a partial pressure of the nitrogen precursor to a partial pressure of the one or more Group III precursors within the chamber is at least about 5,600. The nitrogen precursor and the two or more Group III precursors are decomposed in the chamber to form the ternary III-nitride material. The fully grown layer of ternary III-nitride material has an average final thickness greater than about one hundred nanometers (100 nm) and comprises a plurality of V-pits therein having an average pit width of about two hundred nanometers (200 nm) or less. Further, a relaxed lattice parameter mismatch between the fully grown layer of ternary III-nitride material and the binary III-nitride material is at least about 0.5% of the relaxed average lattice parameter of the binary III-nitride material.

Further aspects, details, and alternate combinations of the elements of embodiments of the disclosure will be apparent from the following detailed description.

BRIEF DESCRIPTION OF THE DRAWINGS

Embodiments of the disclosure may be understood more fully by reference to the following detailed description of example embodiments, which are illustrated in the appended figures in which.

DETAILED DESCRIPTION

Figure 1:
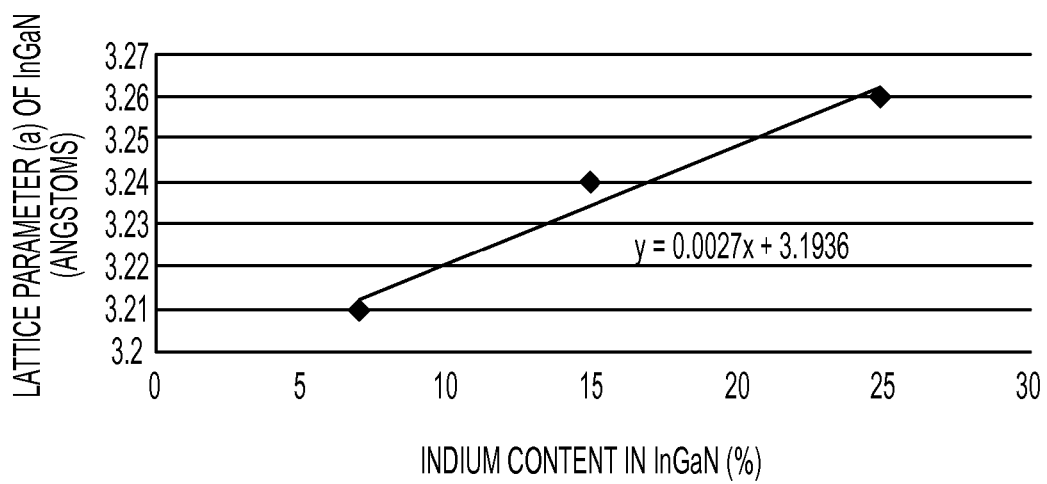
FIG. 1 is a graph that may be used to approximate the relaxed lattice parameter of InGaN as a function of indium content therein.

The illustrations presented herein are not meant to be actual views of any particular material, device, or method, but are merely idealized representations, which are employed to describe embodiments of the present disclosure.

The following description provides specific details, such as material types and processing conditions, in order to provide a thorough description of embodiments of the present disclosure and implementation thereof. However, a person of ordinary skill in the art will understand that the embodiments of the present disclosure may be practiced without employing these specific details and in conjunction with conventional fabrication techniques. In addition, the description provided herein does not form a complete process flow for manufacturing a semiconductor structure or device. Only those process acts and structures necessary to understand the embodiments of the present disclosure are described in detail herein.

As used herein, the term "semiconductor structure" means and includes any structure that is used in the formation of a semiconductor device. Semiconductor structures include, for example, dies and wafers (e.g., carrier substrates and device substrates), as well as assemblies or composite structures that include two or more dies and/or wafers three-dimensionally integrated with one another. Semiconductor structures also include fully fabricated semiconductor devices, as well as intermediate structures formed during fabrication of semiconductor devices. Semiconductor structures may comprise conductive materials, semiconductive materials, non-conductive materials (e.g., electrical insulators), and combinations thereof.

As used herein, the term "III/V semiconductor material" means and includes any semiconductor material that is at least predominantly comprised of one or more elements from Group IIIA of the periodic table (B, Al, Ga, In, and Tl) and one or more elements from Group VA of the periodic table (N, P, As, Sb, and Bi). For example, III/V semiconductor materials include, but are not limited to, GaN, GaP, GaAs, InN, InP, InAs, AlN, AlP, AlAs, InGaN, InGaP, InGaNP, etc.

As used herein, the term "III-nitride semiconductor material" means and includes any III/V semiconductor material that is at least comprised of one or more elements from Group IIIA of the periodic table (B, Al, Ga, In, and Tl) and nitrogen. For example, III-nitride semiconductor materials include GaN, InN, AlN, InGaN, GaAlN, InAlN, etc.

As used herein, the terms "indium gallium nitride" and "InGaN" mean alloys of indium nitride (InN) and gallium nitride (GaN) having a composition of $In_xGa_{1-x}N$, where $0<x<1$.

As used herein, the term "critical thickness" means the average total thickness of a layer of semiconductor material at which, and beyond which, pseudomorphic growth discontinues and the layer undergoes strain relaxation.

As used herein, the term "growth surface" means any surface of a semiconductor substrate or layer at which additional growth of the semiconductor substrate or layer can be carried out.

As used herein, the terms "chemical vapor deposition" and "CVD" are synonymous and mean and include any process used to deposit solid material(s) on a substrate in a reaction chamber in which the substrate is exposed to one or more reagent gasses, which react, decompose, or both react and decompose in a manner that results in the deposition of the solid material(s) on a surface of the substrate.

As used herein, the terms "vapor phase epitaxy" and "VPE" are synonymous and mean and include any CVD process in which the substrate is exposed to one or more reagent vapors, which react, decompose, or both react and decompose in a manner that results in the epitaxial deposition of the solid material(s) on a surface of the substrate.

As used herein, the terms "halide vapor phase epitaxy" and "HVPE" are synonymous and mean and include any VPE process in which at least one reagent vapor used in the VPE process comprises a halide vapor.

As used herein, the term "substantially" refers to a result that is complete except for any deficiencies normally expected in the art.

Embodiments of the disclosure may have applications to a wide range of III/V semiconductor materials. For example, the methods and structures of the embodiments of the disclosure may be applied to III-nitrides, III-arsenides, III-phosphides and III-antimonides. Particular applications pertain to growing ternary Group III-nitride semiconductor materials containing indium, such as indium gallium nitride (InGaN). Accordingly, the following description and figures focus particularly on InGaN, although InGaN is a non-limiting example embodiment, and additional embodiments may include the formation of other ternary III/V semiconductor materials.

A ternary III-nitride layer grown heteroepitaxially to a thickness above a critical thickness may undergo strain relaxation to relieve strain in the crystal lattice resulting from lattice mismatch. Upon the onset of strain relaxation in the ternary III-nitride material, an increased amount of a Group III element, such as indium or aluminum, may be incorporated into the layer of ternary III-nitride material during growth, which may result in a non-uniform concentration profile of the Group III element across a thickness of the layer of ternary III-nitride material. For example, an InGaN layer may include an increased indium percentage proximate to a growth surface of the layer relative to proximate an underlying substrate or other material. Such a non-uniform indium composition in the InGaN layer may be undesirable for at least some applications.

Additionally, the strain relaxation of the ternary III-nitride layer may also result in roughening of the growth surface of the ternary III-nitride layer. Such surface roughening may be detrimental to the production of semiconductor devices using the ternary III-nitride layer. Further, strain relaxation in a ternary III-nitride layer may result in an increased density of defects in the crystalline structure of the ternary III-nitride material. Such defects may include, for example, dislocations and regions of inhomogeneous composition (i.e., phase-separated regions).

As a non-limiting example, for the case of InGaN (a III-nitride material), InGaN layers may be deposited heteroepitaxially on an underlying substrate, which may have a crystal lattice that does not match that of the overlying InGaN layer. For example, InGaN layers may be deposited on a semiconductor substrate comprising gallium nitride (GaN). The GaN may have a relaxed (i.e., substantially strain free) in-plane lattice parameter of approximately 3.189 Å, and the InGaN layers may have a relaxed in-plane lattice parameter, depending on the corresponding percentage of indium content, of approximately 3.21 Å (for 7% indium, i.e., $In_{0.07}Ga_{0.93}N$), approximately 3.24 Å (for 15% indium, i.e., $In_{0.15}Ga_{0.85}N$), and approximately 3.26 Å (for 25% indium, i.e., $In_{0.25}Ga_{0.75}N$). FIG. 1 is a graph illustrating these data points, and shows a line fitted to these data points. The equation of the line is given by $y=0.0027x+3.1936$, and this linear equation may be used to approximate the lattice parameter of InGaN as a function of indium content over the range extending from about 5% to about 25%, wherein x is the percentage of indium in the InGaN and y is the relaxed in-plane lattice parameter of the InGaN.

Figure 2:
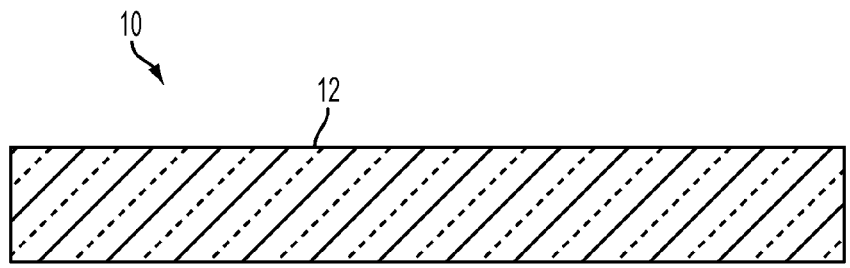
FIG. 2 is a simplified, schematically illustrated cross-sectional side view of a substrate on or over which a III/V semiconductor material may be deposited.
Figure 3:
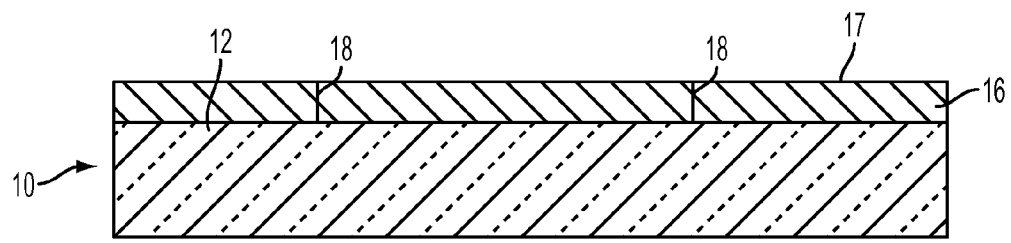
FIG. 3 is a simplified, schematically illustrated cross-sectional side view of a semiconductor structure that includes a first III/V semiconductor material deposited on a surface of the substrate of FIG. 2.
Figure 4:
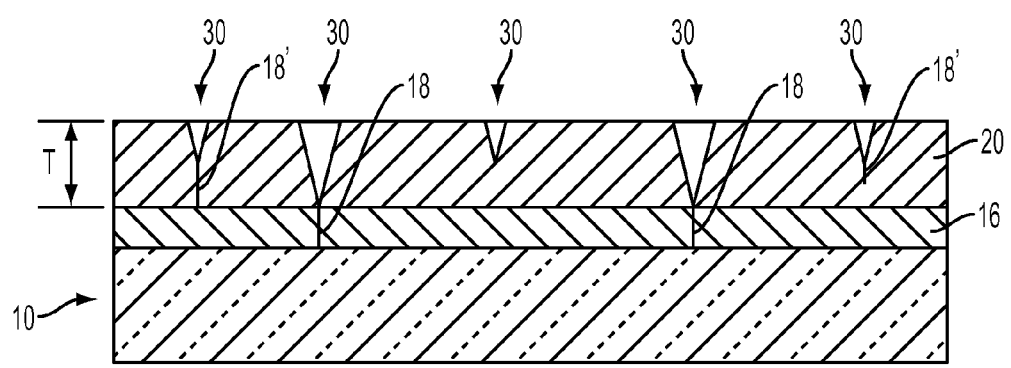
FIG. 4 is a simplified, schematically illustrated cross-sectional side view of a semiconductor structure that includes a second III/V semiconductor material deposited on the first III/V semiconductor material of FIG. 3 on a side thereof opposite the substrate of FIG. 2.

FIGS. 2 through 4 are used to illustrate the fabrication of a layer of ternary III/V semiconductor material in accordance with embodiments of the disclosure, and, in particular, a layer of InGaN 20, which is shown in FIG. 4. Referring to FIG. 2, a substrate 10 may be provided. The substrate 10 may be at least substantially comprised of a ceramic such as an oxide (e.g., silicon dioxide ($SiO_2$) or aluminum oxide ($Al_2O_3$) (e.g., sapphire, which is $\alpha$-$Al_2O_3$)) or a nitride (e.g., silicon nitride ($Si_3N_4$) or boron nitride (BN)). As additional examples, the substrate 10 may be at least substantially comprised of a semiconductor material such as silicon (Si), germanium (Ge), a III/V semiconductor material, etc. The substrate 10 may have a crystalline structure, and the crystal structure of the substrate 10 may have a known, selected orientation, such that an exposed major surface 12 of the substrate 10 over which the layer of InGaN 20 (FIG. 4) is to be grown comprises a known, selected crystallographic plane of the crystal structure of the substrate 10. For example, the substrate 10 may comprise sapphire with a (0001) crystallographic orientation, which is often referred to as "c-plane sapphire."

Referring to FIG. 3, optionally, a layer of a binary III/V semiconductor material, such as a layer of GaN 16 may be formed on the major surface 12 of the substrate 10. The layer of GaN 16 may comprise what are referred to in the art as "buffer" layers or "transition" layers. The GaN 16 may be substantially crystalline, and may be at least substantially comprised by a single crystal of GaN. The layer of GaN 16 may have an average total thickness in a range extending from about two nanometers (2 nm) to about one hundred microns (100 μm). The figures herein are not drawn to scale, and, in actuality, the layer of GaN 16 may be relatively thin compared to the substrate 10.

Optionally, one or more intermediate layers of material (not shown), such as another layer of semiconductor material, may be disposed between the layer of GaN 16 and the substrate 10. Such intermediate layers of material may be used, for example, as a seed layer for forming the layer of GaN 16 thereon, or as a bonding layer for bonding the layer of GaN 16 to the substrate 10. Such bonding processes may be used when it is difficult or impossible to form the layer of GaN 16 directly on the substrate 10. In addition, bonding of the layer of GaN 16 to the substrate 10 may be desired if the layer of GaN 16 has a polar crystal orientation. In such embodiments, the bonding process may be utilized to alter the polarity of the polar GaN, or to provide the growth surface of the GaN with a desirable polarity.

The layer of GaN 16 may be formed on the major surface 12 of the substrate 10 using a chemical vapor deposition (CVD) process, such as a metalorganic chemical vapor deposition (MOCVD) process, a molecular beam epitaxy (MBE) process, or a metal halide vapor phase epitaxy (HVPE) process. HVPE systems and processes that may be employed to form the layer of GaN 16 are disclosed, for example, in U.S. Patent Application Publication No. 2009/0223442 A1, which published Sep. 10, 2009 in the name of Arena et al., provisional U.S. Patent Application Ser. No. 61/157,112, which was filed Mar. 3, 2009 in the name of Arena et al., U.S. patent application Ser. No. 12/894,724, which was filed Sep. 30, 2010 in the name of Bertram, and provisional U.S. Patent Application Ser. No. 61/416,525, which was filed Nov. 23, 2010 in the name of Arena et al., the disclosure of each of which is incorporated herein in its entirety by this reference. Briefly, in such HVPE processes, epitaxial growth of the layer of GaN 16 on the surface 12 of the substrate 10 may result from a vapor phase reaction between gallium mono-chloride (GaCl) and ammonia ($NH_3$) that is carried out within a reaction chamber at elevated temperatures between about 500° C. and about 1,000° C. The $NH_3$ may be supplied from a standard source of $NH_3$ gas. In some methods, the GaCl vapor is provided by passing hydrogen chloride (HCl) gas (which may be supplied from a standard source of HCl gas) over heated liquid gallium (Ga) to form GaCl in situ within the reaction chamber. The liquid gallium may be heated to a temperature of between about 750° C. and about 850° C. The GaCl and the $NH_3$ may be directed to (e.g., over) the major surface 12 of the substrate 10, which may be heated.

The layer of GaN 16 may have a crystal structure like that of the substrate 10, and may be grown epitaxially on the substrate 10. In other words, the crystal structure of the layer of GaN 16 may be aligned and oriented with a similar crystal structure of the underlying substrate 10. Although the crystal structure of the layer of GaN 16 may be similar to that of the underlying substrate 10, the relaxed lattice parameter of the layer of GaN 16 may differ from the relaxed lattice parameter of the substrate 10. As a result, certain imperfections or defects may be formed within the crystal structure of the layer of GaN 16. For example, dislocations 18 (e.g., edge dislocations and/or screw dislocations) may be present in the crystal structure of the layer of GaN 16, as shown in FIG. 3. At least some such dislocations 18 may originate at the interface between the layer of GaN 16 and the major surface 12 of the substrate 10. While only two dislocations 18 are shown in the simplified illustration of FIG. 3, in reality, the density of such dislocations 18 in the layer of GaN 16 may be as high as one hundred thousand per square centimeter ($10^5/cm^2$), or even as high as one million per square centimeter ($10^6/cm^2$) or more. Any of various methods known in the art may be used to reduce the density of dislocations 18 in the layer of GaN 16, as the layer of GaN 16 is formed. Such methods include, for example, epitaxial lateral overgrowth (ELO), pendeo-epitaxy, in-situ masking techniques, etc.

Referring to FIG. 4, a layer of ternary III/V semiconductor material, such as a layer of InGaN 20, may be epitaxially grown or otherwise formed on a major surface 17 (FIG. 3) of the layer of GaN 16. The layer of InGaN 20 may be substantially crystalline, and may be at least substantially comprised by a single crystal of InGaN. The layer of InGaN 20 may have an average final total thickness T greater than about one hundred nanometers (100 nm). In some embodiments, the average final total thickness T may be greater than about one hundred and fifty nanometers (150 nm), or even greater than about two hundred nanometers (200 nm), and may be less than a critical thickness of the layer of InGaN 20.

The layer of InGaN 20 may be deposited on the major surface 17 of the layer of GaN 16 using a chemical vapor deposition (CVD) process, such as a metalorganic chemical vapor deposition (MOCVD) process, a molecular beam epitaxy (MBE) process, or a metal halide vapor phase epitaxy (HVPE) process. HVPE systems and processes that may be employed to form the layer of InGaN 20 are disclosed, for example, in the aforementioned U.S. Patent Application Publication No. US 2009/0223442 A1, which published Sep. 10, 2009 in the name of Arena et al., provisional U.S. Patent Application Ser. No. 61/157,112, which was filed Mar. 3, 2009 in the name of Arena et al., U.S. patent application Ser. No. 12/894,724, which was filed Sep. 30, 2010 in the name of Bertram, and provisional U.S. Patent Application Ser. No. 61/416,525, which was filed Nov. 23, 2010 in the name of Arena et al.

The layer of InGaN 20 may be formulated to have a composition of $In_xGa_{(1-x)}N$, wherein x is at least about 0.05. In some embodiments, x may be between about 0.05 and about 0.10. In other words, the indium content in the layer of InGaN 20 may be between about five atomic percent (5 at %) and about ten atomic percent (10 at %).

The layer of GaN 16 may have a relaxed (i.e., substantially strain free), in-plane (i.e., in the plane parallel to the growth surface) lattice parameter of approximately 3.189 Å, and the layer of InGaN 20 may have a relaxed in-plane lattice parameter, depending on the corresponding percentage of indium content. As previously mentioned, the layer of InGaN 20 may have a relaxed in-plane lattice parameter of approximately 3.21 Å for 7 at % indium (i.e., $In_{0.07}Ga_{0.93}N$). Additionally, using the equation of the line as given by y=0.0027x+3.1936 as shown in the graph of FIG. 1 to estimate the relaxed in-plane lattice parameter, the layer of InGaN 20 may have a relaxed in-plane lattice parameter of approximately 3.207 Å for 5 at % indium (i.e., $In_{0.05}Ga_{0.95}N$), and a relaxed in-plane lattice parameter of approximately 3.220 Å for 10 at % indium (i.e., $In_{0.10}Ga_{0.90}N$).

In some embodiments, a relaxed lattice parameter mismatch between the layer of InGaN 20 and the layer of GaN 16 may be between about 0.5% and about 1.0% of the relaxed average lattice parameter of the layer of GaN 16. The relaxed lattice parameter mismatch may be determined using the equation $M=100((a_2-a_1)/a_1)$, wherein M is the relaxed lattice parameter mismatch, $a_1$ is the relaxed average lattice parameter of the layer of GaN 16, and $a_2$ is the relaxed average lattice parameter of the layer of InGaN 20. For example, when the layer of InGaN 20 includes 5 at % indium and has a relaxed in-plane lattice parameter of approximately 3.207 Å, a relaxed lattice parameter mismatch between the layer of InGaN 20 and the layer of GaN 16 may be about 0.56% (i.e., 0.56=100((3.207–3.189)/3.189)) of the relaxed average lattice parameter of the layer of GaN 16. When the layer of InGaN 20 includes 10 at % indium and has a relaxed in-plane lattice parameter of approximately 3.220 Å, a relaxed lattice parameter mismatch between the layer of InGaN 20 and the layer of GaN 16 may be about 0.97% of the relaxed average lattice parameter of the layer of GaN 16.

As a result of the mismatch between the relaxed lattice parameters of the layer of GaN 16 and the layer of InGaN 20, the layer of InGaN 20 will grow lattice mismatched on the layer of GaN 16. Generally, the lattice mismatched growth (i.e., mismatch between the layer of InGaN 20 and the layer of GaN 16) is accompanied with strain relaxation when the strain energy stored in the layer of InGaN 20 is greater than the strain energy that will result in nucleation of additional dislocations 18' within the layer of InGaN 20. This lattice mismatched growth occurs for a lattice arranged in cubic systems but is more complex for materials with hexagonal lattice structure like GaN, InGaN, and AlGaN. In hexagonal layers, there may not be an easy gliding plane for dislocations, and, therefore, much higher strain energy may be stored in the layer of InGaN 20 prior to nucleating dislocations therein. Upon reaching plastic relaxation, relaxation may occur by modification of an exposed major surface 22 (FIG. 5) of the layer of InGaN 20, which is the growth surface thereof. When the growth surface comprises the (0001) plane in the hexagonal crystal structure, pit defects 30 may occur. These pit defects 30 appear as inverted pyramids with an apex at or near a dislocation 18, 18' (e.g., a threading dislocation) and are referred to hereinafter as V-pits 30. As the layer of InGaN 20 grows, the sizes of the V-pits 30 also grow.

Figure 5:
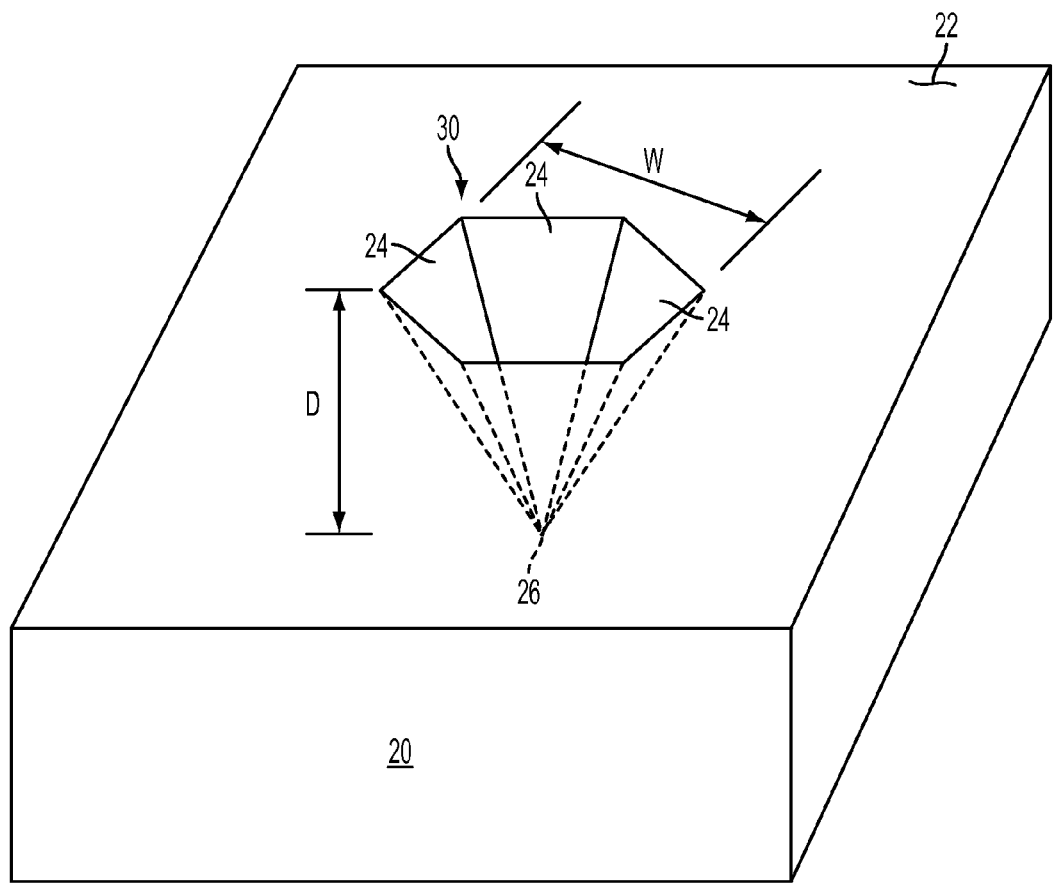
FIG. 5 is a simplified, schematically illustrated perspective view of a portion of the semiconductor structure of FIG. 4 and illustrates a V-pit in the second III/V semiconductor material.

FIG. 5 is a simplified isometric drawing illustrating a V-pit 30 in the layer of InGaN 20. The V-pit 30 extends into the exposed major surface 22 of the layer of InGaN 20, which is the growth surface of the layer of InGaN 20. The hexagonal shape of the opening on the growth surface 22 results from the hexagonal crystal structure of the InGaN material. The V-pit 30 is defined by sidewalls 24 (facets) of the layer of InGaN 20 within the V-pit 30, which extend from an apex 26 of the V-pit 30 to the exposed major surface 22 of the layer of InGaN 20. The apex 26 is the location at which the V-pit 30 originated during growth of the layer of InGaN 20.

As shown in FIG. 5, the V-pit 30 has a pit depth D, which is the distance the V-pit 30 extends into the layer of InGaN 20 (i.e., the shortest distance from the apex 26 to the plane of the exposed major surface 22 of the layer of InGaN 20). Additionally, the V-pit 30 has a pit width W, which is the distance across the opening of the V-pit 30 in the plane of the exposed major surface 22 of the layer of InGaN 20 from one side thereof (as defined by the intersection between a sidewall 24 with the exposed major surface 22) to an opposing side thereof (as defined by the intersection between an opposing sidewall 24 and the exposed major surface 22). The pit widths W of V-pits 30 formed in the layers of InGaN 20 may be measured using, for example, Atomic Force Microscopy (AFM). V-pits 30 generally have a fixed ratio of pit width W to pit depth D, which is due to the nature and orientation of the crystal structure. Therefore, the pit depth D of a V-pit 30 can be estimated based on a measured pit width W of the V-pit 30. In other words, from crystallographic considerations (e.g., the angle between the (00010-00011) and (0001) planes), the pit depth D can be calculated from the measured pit width W (see, e.g., J. E. Northrup, L. T. Romano, J. Neugebauer, *Appl. Phys. Lett.* 74(16), 2319 (1999)).

Referring again to FIG. 4, the layer of InGaN 20 may include dislocations 18, 18' that extend within the layer of GaN 16 and into the layer of InGaN 20, that originate at the interface between the layer of GaN 16 and the layer of InGaN 20 and extend into the layer of InGaN 20, and that originate and extend within the layer of InGaN 20. V-pits 30 may result from any such dislocations 18, 18'. V-pits 30 having an apex 26 proximate the interface between the layer of InGaN 20 and the layer of GaN 16 are relatively larger (i.e., have a wider pit width W and a deeper pit depth D) compared to V-pits 30 having an apex 26 at an intermediate location within the layer of InGaN 20.

In some applications, the layer of InGaN 20 may be separated from the underlying layer of GaN 16 and transferred to another substrate for further processing and device fabrication after the layer of InGaN 20 has been grown on the layer of GaN 16. Relatively large V-pits 30, such as those that originate proximate the interface between the layer of InGaN 20 and the layer of GaN 16, can result in holes that extend at least substantially entirely through the layer of InGaN 20 after the layer of InGaN 20 has been transferred in such a process. The V-pits 30 may also adversely affect the processes used to separate the layer of InGaN 20 from the layer of GaN 16 and transfer the layer of InGaN 20 to another substrate. The presence of the V-pits 30 in the layer of InGaN 20 may adversely affect light-emitting diodes (LEDs) formed from the layer of InGaN 20. For example, if a V-pit 30 extends across the entire thickness of the layer of InGaN 20, it may short out the diode portion of an LED device including the portion of the layer of InGaN 20 in which the V-pit 30 is disposed, rendering the LED device inoperable.

The strain energy stored within the layer of InGaN 20 is proportional to the average total thickness T of the layer of InGaN 20, and to the concentration of indium in the layer of InGaN 20. Thus, the relative difference in the strain energy stored within the layer of InGaN 20 for different indium contents and average total thicknesses T for the layer of InGaN 20 may be estimated using the relationship $E_W \propto T(C_{In})$, wherein $E_E$ is the elastic energy within the layer of InGaN 20 (in arbitrary units), T is the average total thicknesses of the layer of InGaN 20, and $C_{In}$ is the concentration of indium in the layer of InGaN 20 expressed as an atomic percentage. For example, if the layer of InGaN 20 has an average total thickness T of one hundred and fifty nanometers (150 nm) and an indium concentration of 8.5 at %, the elastic energy $E_E$ within the layer of InGaN 20 may be about 1,275 (1,275=150(8.5)). It, however, the layer of InGaN 20 has an average total thickness T of two hundred nanometers (200 nm) and an indium concentration of 9.0 at %, the elastic energy $E_E$ within the layer of InGaN 20 may be about 1,800 (1,800=200(9.0)).

Thus, relatively thin layers of InGaN 20 will have lower elastic energy therein, and can be grown with few or no V-pits 30. However, for some applications, a relatively thicker layer of InGaN 20 may be desirable. As a consequence, with conventional processing, V-pits 30 are present in the relatively thicker layer of InGaN 20 and the V-pits 30 become deeper and wider with increasing thickness of the layer of InGaN 20.

Embodiments of the present disclosure may be used to reduce the size of V-pits 30 formed when a layer of ternary III-nitride material, such as a layer of InGaN 20, is formed over a layer of binary III-nitride material, such as a layer of GaN 16. Thus, for a given average total thickness of the layer of ternary III-nitride material, the V-pits 30 may have a relatively smaller pit width and/or pit depth when the layer of ternary III-nitride material is formed in accordance with embodiments of methods disclosed herein, relative to previously known methods for forming such layers of ternary III-nitride material.

As previously mentioned, the layer of InGaN 20 may be deposited on the major surface 17 of the layer of GaN 16 using a chemical vapor deposition (CVD) process, such as a metalorganic chemical vapor deposition (MOCVD) process, a molecular beam epitaxy (MBE) process, or a metal halide vapor phase epitaxy (HVPE) process. Such processes may be carried out within an enclosed chamber (e.g., a deposition or reaction chamber). The substrate 10 and the layer of GaN 16 thereon may be provided within the chamber. The chamber, and the substrate 10 and the layer of GaN 16 therein, may be heated to a temperature or temperatures between about 500° C. and about 1,000° C. A precursor gas mixture is introduced or otherwise provided within the chamber. To form a III-nitride semiconductor material, the precursor gas mixture is selected to comprise one or more Group III precursors and a nitrogen precursor. At least a portion of the one or more Group III precursors and at least a portion of the nitrogen precursor decompose within the heated chamber proximate the surface on which the III-nitride semiconductor material is to be formed. Upon decomposition, the elemental species deposit and combine in an ordered manner on the growth surface to form the III-nitride semiconductor material.

The precursor gas mixture optionally may include additional gasses or reactants, such as inert gasses (e.g., nitrogen) and/or reactant species used to incorporate dopants into the layer of InGaN 20. As non-limiting examples, silane ($SiH_4$) may be introduced as an N-type dopant, and magnesium may be introduced as a P-type dopant.

The nitrogen precursor may comprise, for example, ammonia ($NH_3$). The one or more Group III precursors may comprise, for example, one or more of trimethylindium (TMI), triethylindium (TEI), and triethylgallium (TEG). The nitrogen precursor and the one or more Group III precursors may be present within the chamber as gasses and/or vapors (the term "gas" as used herein encompassing both gasses and vapors), and the precursors may be caused to flow through the chamber during processing. The chamber may be under vacuum (i.e., the pressure within the chamber may be below atmospheric pressure) during processing.

In accordance with embodiments of the disclosure, the precursor gas mixture may be formulated in such a manner as to cause a ratio of a partial pressure of the nitrogen precursor to a partial pressure of the one or more Group III precursors within the chamber to be in a range extending from about 5,600 to about 6,600. It has been discovered that such a high ratio of the nitrogen precursor to a partial pressure of the one or more Group III precursors may result in V-pits 30 formed in the layer of InGaN 20 to be relatively smaller when compared to layers of InGaN 20 formed with relatively lower partial pressure ratios. For example, referring again to FIG. 5, in accordance with some embodiments, the average pit width W of the V-pits 30 in a layer of InGaN 20 formed as described herein may be about two hundred nanometers (200 nm) or less, or even about one hundred and fifty nanometers (150 nm) or less. Further, in such embodiments, the layer of InGaN 20 may have an average total thickness T (FIG. 4) of greater than about one hundred nanometers (100 nm), greater than about one hundred and fifty nanometers (150 nm), or even greater than about two hundred nanometers (200 nm).

As known in the art, the partial pressures of the precursors within the chamber are related to the flow rates of the precursors through the chamber. Thus, the partial pressures of the precursors within the chamber may be selectively controlled and tailored by selectively controlling and tailoring the flow rates of the precursors through the chamber.

Figure 6:
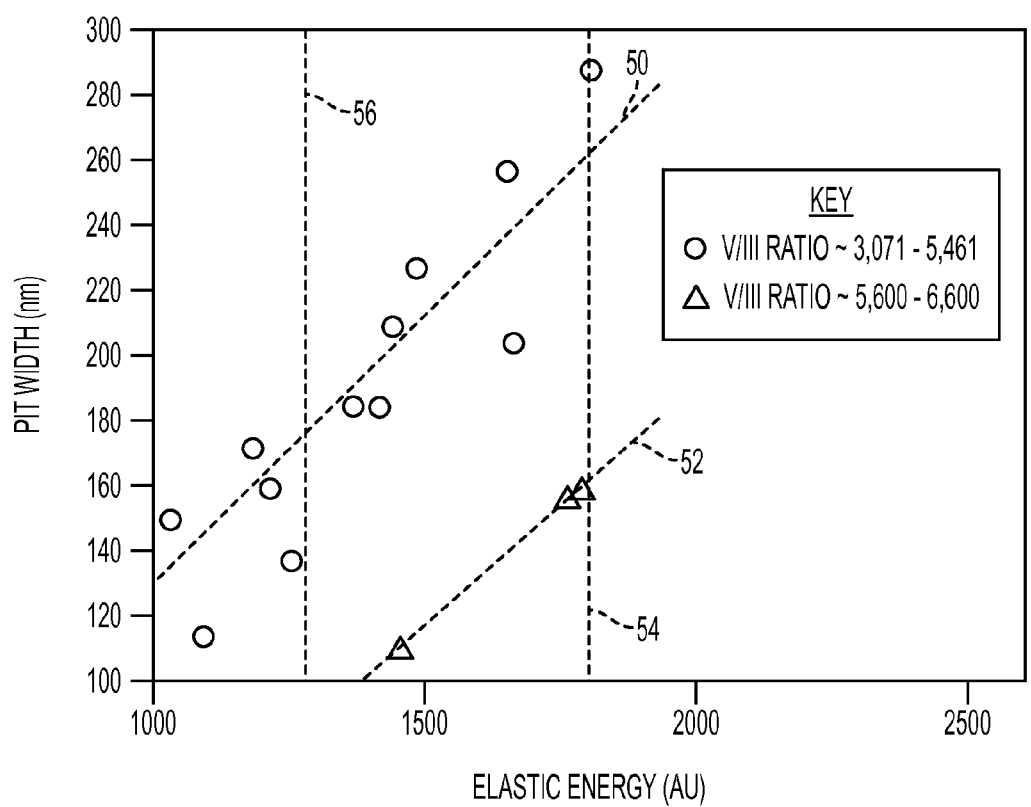
FIG. 6 is a graph illustrating the observed variation in average width of V-pits formed in ternary III/V semiconductor material as a function of variation in elastic energy within the ternary III/V semiconductor material for different ranges of the ratio of Group V precursors to Group III precursors.

FIG. 6 is a graph illustrating the observed variation in average pit width W of V-pits 30 formed in a layer of InGaN 20 as a function of variation in elastic energy within the layers of InGaN 20 for different ranges of the ratio of a partial pressure of the nitrogen precursor to a partial pressure of the one or more Group III precursors within the chamber during the respective depositions of the layers of InGaN 20. As previously mentioned, the relative difference in the strain energy stored within layers of InGaN 20 for different indium contents and average total thicknesses T for the layer of InGaN 20 may be estimated using the relationship $E_E \propto T(C_{IN})$, wherein $E_E$ is the elastic energy within the layer of InGaN 20 (in arbitrary units), T is the average total thicknesses of the layer of InGaN 20, and $C_{In}$ is the concentration of indium in the layer of InGaN 20 expressed as an atomic percentage. The elastic energies in FIG. 6 were determined by multiplying the average total thicknesses T of the layers of InGaN 20 in nanometers by the respective indium concentrations in the layers of InGaN 20.

The circles in the chart of FIG. 6 correspond to the layers of InGaN 20 fabricated using processes in which the ratio of the partial pressure of the nitrogen precursor to the partial pressure of the one or more Group III precursors within the chamber during deposition was within the range extending from about 3,071 to about 5,461. In contrast, the triangles in the chart of FIG. 6 correspond to the layers of InGaN 20 fabricated using processes according to embodiments of methods as disclosed herein, in which the ratio of the partial pressure of the nitrogen precursor to the partial pressure of the one or more Group III precursors within the chamber during deposition was within the range extending from about 5,600 to about 6,600. The trend line 50 in FIG. 6 approximates the relationship between the elastic energy within the layers of InGaN 20 and the measured pit widths W of the V-pits 30 formed therein for the samples fabricated using processes in which the partial pressure ratio was within the range extending from about 3,071 to about 5,461, as mentioned above. Similarly, the trend line 52 in FIG. 6 approximates the relationship between the elastic energy within the layers of InGaN 20 and the measured pit widths W of the V-pits 30 formed therein for the samples fabricated using processes in which the partial pressure ratio was within the range extending from about 5,600 to about 6,600, as described above. As can be seen by comparing the trend line 50 with the trend line 52 in the chart of FIG. 6, for any given elastic energy within the layers of InGaN 20, the measured pit widths W of the V-pits 30 are relatively smaller in the samples fabricated using processes in which the partial pressure ratio was within the range extending from about 5,600 to about 6,600, relative to the measured pit widths W of the V-pits 30 in the samples fabricated using processes in which the partial pressure ratio was within the range extending from about 3,071 to about 5,461.

As an example, the vertical line 54 in FIG. 6 is located at an elastic energy of 1,800, and may correspond to layers of InGaN 20 having an average total thickness T of about two hundred nanometers (200 nm) and an indium content of nine atomic percent (9 at %) (i.e., 1,800=200(9)). As shown in the chart of FIG. 6, such a layer of InGaN 20 fabricated using processes in which the partial pressure ratio was within the range extending from about 5,600 to about 6,600 as described herein may be expected to include V-pits 30 having pit widths W of about one hundred and sixty nanometers (160 nm). In contrast, such a layer of InGaN 20 fabricated using processes in which the partial pressure ratio was within the range extending from about 3,071 to about 5,461 may be expected to include V-pits 30 having larger pit widths W of about two hundred and sixty nanometers (260 nm). As another example, the vertical line 56 in FIG. 6 is located at an elastic energy of 1,275, and may correspond to layers of InGaN 20 having an average total thickness T of about one hundred and fifty nanometers (150 nm) and an indium content of eight and one-half atomic percent (8.5 at %) (i.e., 1,275=150(8.5)). As shown in the chart of FIG. 6, such a layer of InGaN 20 fabricated using processes in which the partial pressure ratio was within the range extending from about 5,600 to about 6,600 as described herein may be expected to include V-pits 30 having pit widths W of less than one hundred nanometers (100 nm). In contrast, such a layer of InGaN 20 fabricated using processes in which the partial pressure ratio was within the range extending from about 3,071 to about 5,461 may be expected to include V-pits 30 having larger pit widths W of about one hundred and seventy nanometers (170 nm).

Without being bound to any theory, it is currently believed that by employing relatively high precursor gas ratios during growth of the layer of InGaN 20, as described herein, the rate at which additional InGaN material is grown on the sidewalls 24 within the V-pits 30 may be increased relative to the rate at which additional InGaN material is grown on the exposed major surface 22 (the growth surface) to result in V-pits 30 of relatively smaller size.

Thus, layers of InGaN 20 (and other ternary III-nitride semiconductor materials) fabricated in accordance with embodiments of methods as described herein, by formulating the precursor gas mixture such that a ratio of a partial pressure of the nitrogen precursor to a partial pressure of the one or more Group III precursors within the chamber is at least about 5,600 (e.g., between about 5,600 and about 6,600), may be formed to have relatively smaller V-pits 30 therein relative to previously known processes in which lower precursor ratios were employed during fabrication of the layers of InGaN.

For example, semiconductor structures may be fabricated that comprise a ternary III-nitride material, such as a layer of InGaN 20. The layer of InGaN 20 may be fabricated by growing the layer of InGaN 20 on a layer of binary III-nitride material, such as a layer of GaN 16, using methods as described hereinabove. The fully grown layer of InGaN 20 may have a final average total thickness T (FIG. 4) greater than about one hundred nanometers (100 nm), greater than about one hundred and fifty nanometers (150 nm), or even greater than about two hundred nanometers (200 nm). The final average total thickness T may be less than a critical thickness of the layer of InGaN 20. The layer of InGaN 20 may comprise at least five atomic percent (5 at %) indium, and may comprise between about five atomic percent (5 at %) indium and about ten atomic percent (10 at %) indium. A relaxed lattice parameter mismatch between the fully grown layer of InGaN 20 and the layer of GaN 16 may be at least about 0.5% of the relaxed average lattice parameter of the layer of GaN 16, and may be between about 0.5% and about 1.0% of the relaxed average lattice parameter of the layer of GaN 16. The fully grown layer of InGaN 20 may comprise a plurality of V-pits 30 therein having an average pit width W (FIG. 5) of about two hundred nanometers (200 nm) or less, or even about one hundred and fifty nanometers (150 nm) or less.

Figure 7:
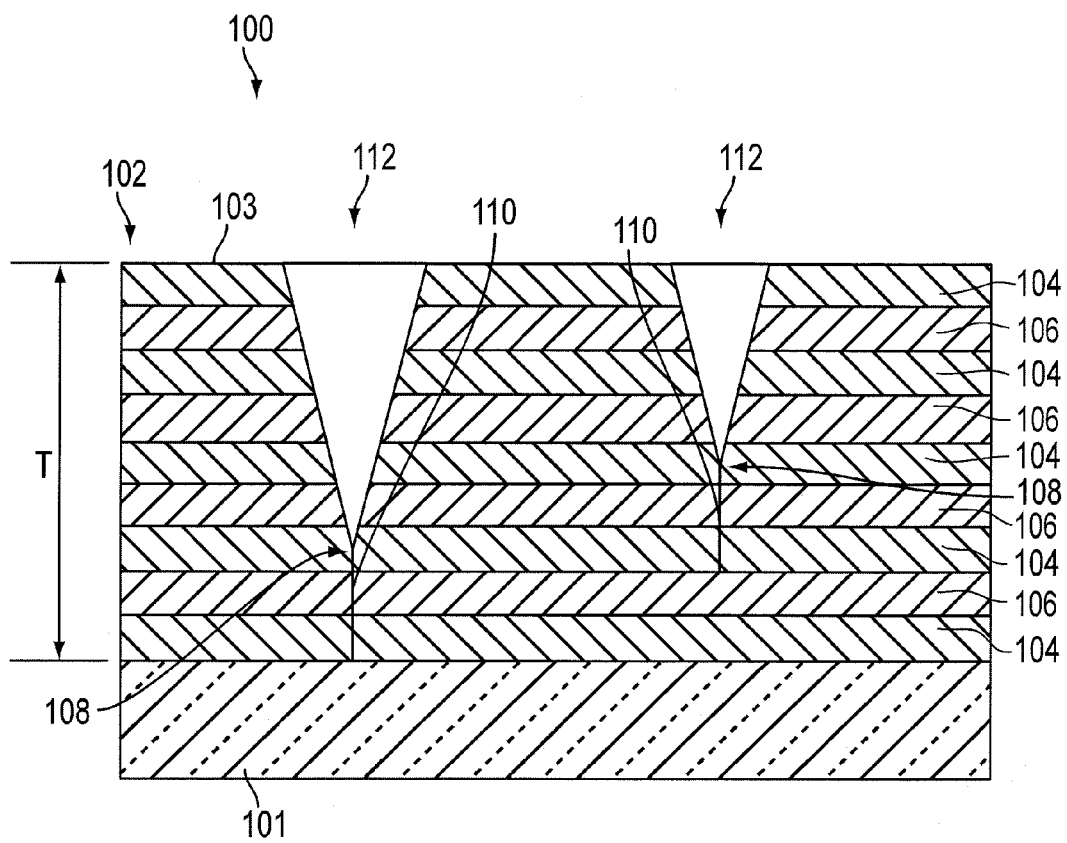
FIG. 7 is a simplified, schematically illustrated cross-sectional side view, like that of FIG. 4, illustrating another embodiment of a semiconductor structure that includes a plurality of alternating layers of binary and ternary III/V semiconductor materials over a substrate, and illustrates V-pits formed within the alternating layers of binary and ternary III/V semiconductor materials.

In the embodiments described above with reference to FIGS. 2 through 5, the semiconductor structure includes a single layer of InGaN 20 on a single underlying layer of GaN 16. The methods described herein, however, also may be used to fabricate semiconductor structures that include a plurality of layers of III-nitride material. For example, FIG. 7 illustrates a semiconductor structure 100 that includes a substrate 101 and a stack 102 comprising a plurality of layers of III-nitride material. The substrate 101 may comprise a substrate as previously described herein in relation to the substrate 10. The stack 102 may comprise a plurality of layers of a binary III-nitride material, such as layers of GaN 104, and a plurality of layers of a ternary III-nitride material, such as layers of InGaN 106. As shown in FIG. 7, the layers of GaN 104 and the layers of InGaN 106 may be disposed in an alternating fashion one over another, such that each layer of GaN 104 is separated from other layers of GaN 104 by a layer of InGaN 106.

Each layer of GaN 104 may be substantially similar to, and may be formed in the same manner as, the previously described layer of GaN 16. Similarly, each layer of InGaN 106 may be substantially similar to, and may be formed in the same manner as, the previously described layer of InGaN 20. In the embodiment of FIG. 7, however, the layers of InGaN 106 may be relatively thinner than the previously described layer of InGaN 20. By way of example and not limitation, each of the layers of GaN 104 and each of the layers of InGaN 106 may have a layer thickness of between about two nanometers (2 nm) and about thirty nanometers (30 nm). The stack 102, however, may have a final average total thickness T like that of the previously described layer of InGaN 20. For example, the stack 102 may have a final average total thickness T greater than about one hundred nanometers (100 nm), greater than about one hundred and fifty nanometers (150 nm), or even greater than about two hundred nanometers (200 nm).

As shown in FIG. 7, dislocations 110 may extend at least partially through one or more of the layers of GaN 104 and the layers of InGaN 106. These dislocations 110 may comprise dislocations as previously described in relation to the dislocations 18, 18' of FIG. 4. Additionally, V-pits 112, like the previously described V-pits 30, may be present within the stack 102. Each of the V-pits 112 may extend into the stack 102 from an exposed major surface 103 thereof (the growth surface), and may extend to an apex 108, which may originate at a dislocation 110. As shown in FIG. 7, at least some of the V-pits 112 may extend through a plurality of the alternating layers of GaN 104 and layers of InGaN 106.

The layers of GaN 104 and the layers of InGaN 106 may be formed as previously described in relation to the layer of GaN 16 and the layer of InGaN 20. In particular, each layer of InGaN 20 may be formed in a reaction chamber using a precursor gas mixture that is formulated in such a manner as to cause a ratio of a partial pressure of a nitrogen precursor to a partial pressure of one or more Group III precursors within the chamber to be in a range extending from about 5,600 to about 6,600, as previously described. As a result, the V-pits 112 may have a relatively smaller pit width W and/or pit depth D, as previously described with reference to FIG. 5.

Additional non-limiting embodiments of the disclosure are described below.

Embodiment 1

A method of forming InGaN, comprising: providing a layer of GaN within a chamber; epitaxially growing a layer of InGaN on a surface of the layer of GaN; and growing the layer of InGaN to an average final thickness greater than about one hundred nanometers (100 nm). Epitaxially growing the layer of InGaN comprises: providing a precursor gas mixture within the chamber; selecting the precursor gas mixture to comprise one or more Group III precursors and a nitrogen precursor; formulating the precursor gas mixture to cause a ratio of a partial pressure of the nitrogen precursor to a partial pressure of the one or more Group III precursors within the chamber to be at least about 5,600; and decomposing at least a portion of the one or more Group III precursors and at least a portion of the nitrogen precursor proximate the surface of the layer of GaN.

Embodiment 2

The method of Embodiment 1, wherein formulating the precursor gas mixture to cause the ratio of the partial pressure of the nitrogen precursor to the partial pressure of the one or more Group III precursors within the chamber to be at least about 5,600 comprises formulating the precursor gas mixture to cause the ratio to be in a range extending from 5,600 to 6,600.

Embodiment 3

The method of Embodiment 1, further comprising selecting the average final thickness to be less than a critical thickness of the layer of InGaN.

Embodiment 4

The method of any one of Embodiments 1 through 3, wherein epitaxially growing the layer of InGaN on the surface of the layer of GaN comprises depositing the layer of InGaN on the surface of the layer of GaN using a halide vapor phase epitaxy (HVPE) process or a metalorganic vapor phase epitaxy (MOVPE) process.

Embodiment 5

The method of any one of Embodiments 1 through 4, wherein growing the layer of InGaN to the average final thickness greater than about 100 nm comprises growing the layer of InGaN to an average final thickness greater than about one hundred and fifty nanometers (150 nm).

Embodiment 6

The method of Embodiment 5, wherein growing the layer of InGaN to an average final thickness greater than about 150 nm comprises growing the layer of InGaN to an average final thickness greater than about two hundred nanometers (200 nm).

Embodiment 7

The method of any one of Embodiments 1 through 6, wherein epitaxially growing the layer of InGaN comprises formulating the layer of InGaN to have a composition of $In_xGa_{(1-x)}N$, wherein x is at least about 0.05.

Embodiment 8

The method of Embodiment 7, wherein formulating the layer of InGaN to have a composition of $In_xGa_{(1-x)}N$, wherein x is at least about 0.05 comprises formulating the layer of InGaN to have a composition of $In_xGa_{(1-x)}N$, wherein x is between about 0.05 and about 0.10.

Embodiment 9

The method of any one of Embodiments 1 through 8, wherein epitaxially growing the layer of InGaN on the surface of the layer of GaN further comprises formulating the layer of InGaN such that a relaxed lattice parameter mismatch between the layer of InGaN and the layer of GaN is between about 0.5% and about 1.0% of the relaxed average lattice parameter of the layer of GaN.

Embodiment 10

The method of any one of Embodiments 1 through 9, wherein growing the layer of InGaN to an average final thickness further comprises forming a plurality of V-pits in the layer of InGaN having an average pit width of about two hundred nanometers (200 nm) or less.

Embodiment 11

The method of Embodiment 10, wherein forming the plurality of V-pits having an average pit width of about 200 nm or less comprises forming a plurality of V-pits having an average pit width of about one hundred and fifty nanometers (150 nm) or less.

Embodiment 12

The method of any one of Embodiments 1 through 11, further comprising selecting the nitrogen precursor to comprise ammonia.

Embodiment 13

The method of any one of Embodiments 1 through 12, further comprising selecting the one or more Group III precursors to comprise trimethylindium and triethylgallium.

Embodiment 14

A method of forming a ternary III-nitride material comprising nitrogen, gallium, and at least one of indium and aluminum, comprising: providing a binary III-nitride material within a chamber; and epitaxially growing a layer of ternary III-nitride material on the binary III-nitride material. Epitaxial growth of the layer of ternary III-nitride material includes: providing a precursor gas mixture within the chamber, the precursor gas mixture comprising a nitrogen precursor and two or more Group III precursors; formulating the precursor gas mixture such that a ratio of a partial pressure of the nitrogen precursor to a partial pressure of the two or more Group III precursors within the chamber is at least about 5,600; and decomposing the nitrogen precursor and the two or more Group III precursors in the chamber. The method further includes growing the layer of ternary III-nitride material to an average final thickness greater than about one hundred nanometers (100 nm); formulating the layer of ternary III-nitride material such that a relaxed lattice parameter mismatch between the layer of ternary III-nitride material and the binary III-nitride material is at least about 0.5% of the relaxed average lattice parameter of the binary III-nitride material; and forming a plurality of V-pits in the layer of ternary III-nitride material, the plurality of V-pits having an average pit width of about two hundred nanometers (200 nm) or less in the fully grown layer of ternary III-nitride material.

Embodiment 15

The method of Embodiment 14, wherein formulating the precursor gas mixture such that the ratio of the partial pressure of the nitrogen precursor to the partial pressure of the one or more Group III precursors within the chamber is at least about 5,600 comprises formulating the precursor gas mixture such that the ratio is in a range extending from 5,600 to 6,600.

Embodiment 16

The method of Embodiment 14, further comprising selecting the ternary III-nitride material to comprise indium gallium nitride.

Embodiment 17

The method of any one of Embodiments 14 through 16, further comprising selecting the average final thickness to be less than a critical thickness of the layer of ternary III-nitride material.

Embodiment 18

The method of any one of Embodiments 14 through 17, wherein growing the layer of ternary III-nitride material to the average final thickness greater than about 100 nm comprises growing the layer of ternary III-nitride material to an average final thickness greater than about one hundred and fifty nanometers (150 nm).

Embodiment 19

The method of Embodiment 18, wherein growing the layer of ternary III-nitride material to an average final thickness greater than about 150 nm comprises growing the layer of ternary III-nitride material to an average final thickness greater than about two hundred nanometers (200 nm).

Embodiment 20

The method of any one of Embodiments 14 through 19, wherein formulating the layer of ternary III-nitride material such that a relaxed lattice parameter mismatch between the layer of ternary III-nitride material and the binary III-nitride material is at least about 0.5% of the relaxed average lattice parameter of the binary III-nitride material comprises formulating the layer of ternary III-nitride material such that a relaxed lattice parameter mismatch between the layer of ternary III-nitride material and the binary III-nitride material is at least about 5% of the relaxed average lattice parameter of the binary III-nitride material.

Embodiment 21

The method of any one of Embodiments 14 through 20, further comprising selecting the nitrogen precursor to comprise ammonia.

Embodiment 22

The method of any one of Embodiments 14 through 21, further comprising selecting the two or more Group III precursors to comprise trimethylindium and triethylgallium.

Embodiment 23

A semiconductor structure comprising InGaN, the InGaN formed by a method comprising: providing a layer of GaN within a chamber; and epitaxially growing a layer of InGaN on a surface of the layer of GaN. Epitaxial growth of the layer of InGaN comprises: providing a precursor gas mixture within the chamber; selecting the precursor gas mixture to comprise one or more Group III precursors and a nitrogen precursor; formulating the precursor gas mixture to cause a ratio of a partial pressure of the nitrogen precursor to a partial pressure of the one or more Group III precursors within the chamber to be at least about 5,600; and decomposing at least a portion of the one or more Group III precursors and at least a portion of the nitrogen precursor proximate the surface of the layer of GaN. In Embodiment 23, the fully grown layer of InGaN has an average final thickness greater than about one hundred nanometers (100 nm); a relaxed lattice parameter mismatch between the fully grown layer of InGaN and the layer of GaN is at least about 0.5% of the relaxed average lattice parameter of the layer of GaN; and the fully grown layer of InGaN comprises a plurality of V-pits therein having an average pit width of about two hundred nanometers (200 nm) or less.

Embodiment 24

The semiconductor structure of Embodiment 23, wherein the layer of InGaN in formed in accordance with any one of Embodiments 1 through 13.

Embodiment 25

A semiconductor structure comprising a ternary III-nitride material comprising nitrogen, gallium, and at least one of indium and aluminum, the ternary III-nitride material formed by a method comprising: providing a substrate comprising a binary III-nitride material within a chamber; and epitaxially growing a layer of ternary III-nitride material on the binary III-nitride material. Epitaxial growth of the layer of ternary III-nitride material includes: providing a precursor gas mixture within the chamber, the precursor gas mixture comprising a nitrogen precursor and two or more Group III precursors; formulating the precursor gas mixture such that a ratio of a partial pressure of the nitrogen precursor to a partial pressure of the two or more Group III precursors within the chamber is at least about 5,600; and decomposing the nitrogen precursor and the two or more Group III precursors in the chamber. In Embodiment 24, the fully grown layer of ternary III-nitride material has an average final thickness greater than about one hundred nanometers (100 nm); a relaxed lattice parameter mismatch between the fully grown layer of ternary III-nitride material and the binary III-nitride material is at least about 0.5% of the relaxed average lattice parameter of the binary III-nitride material; and the fully grown layer of ternary III-nitride material comprises a plurality of V-pits therein having an average pit width of about two hundred nanometers (200 nm) or less.

Embodiment 26

The semiconductor structure of Embodiment 25, wherein the layer of ternary III-nitride material is formed in accordance with any one of Embodiments 14 through 22.

Embodiment 27

A method of forming a stack of layers of III-nitride material, comprising: providing a substrate within a chamber; epitaxially growing at least one layer of GaN and a plurality of layers of InGaN over the substrate within the chamber; and forming the stack of layers of III-nitride material to have a final average total thickness greater than about one hundred nanometers (100 nm), wherein epitaxial growth of at least one layer of InGaN of the plurality of layers of InGaN comprises: providing a precursor gas mixture within the chamber; selecting the precursor gas mixture to comprise one or more Group III precursors and a nitrogen precursor; formulating the precursor gas mixture to cause a ratio of a partial pressure of the nitrogen precursor to a partial pressure of the one or more Group III precursors within the chamber to be at least about 5,600; and decomposing at least a portion of the one or more Group III precursors and at least a portion of the nitrogen precursor to form the at least one layer of InGaN.

The embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternate useful combinations of the elements described, will become apparent to those skilled in the art from the description. Such modifications are also intended to fall within the scope of the appended claims.

The invention claimed is:

1. A method of forming InGaN, comprising:
  providing a precursor gas mixture within a chamber including one or more Group III precursors and a nitrogen precursor;
  causing a ratio of a partial pressure of the nitrogen precursor to a partial pressure of the one or more Group III precursors within the chamber to be at least about 5,600;
  decomposing at least a portion of the one or more Group III precursors and at least a portion of the nitrogen precursor to provide nitrogen and one or more Group III elements including indium and gallium within the chamber; and
  epitaxially growing InGaN over a substrate within the chamber from the one or more Group III elements and nitrogen within the chamber.

2. The method of claim 1, further comprising selecting the substrate to comprise GaN.

3. The method of claim 1, wherein causing the ratio of the partial pressure of the nitrogen precursor to the partial pressure of the one or more Group III precursors within the chamber to be at least about 5,600 comprises causing the ratio to be in a range extending from 5,600 to 6,600.

4. The method of claim 1, wherein epitaxially growing the InGaN over the substrate within the chamber comprises depositing a layer of InGaN on a surface of a layer of GaN using a halide vapor phase epitaxy (HVPE) process or a metalorganic vapor phase epitaxy (MOVPE) process.

5. The method of claim 1, wherein epitaxially growing the InGaN further comprises growing a layer of InGaN over the substrate to an average thickness of about one hundred nanometers (100 nm) or more.

6. The method of claim 5, wherein growing the layer of InGaN over the substrate to the average final thickness of about 100 nm or more comprises growing the layer of InGaN to an average final thickness of about one hundred and fifty nanometers (150 nm) or more.

7. The method of claim 6, wherein growing the layer of InGaN to the average final thickness of about 150 nm or more comprises growing the layer of InGaN to an average final thickness of about two hundred nanometers (200 nm) or more.

8. The method of claim 1, wherein epitaxially growing the InGaN comprises formulating the InGaN to have a composition of $In_xGa_{(1-x)}N$, wherein x is at least about 0.05.

9. The method of claim 8, wherein formulating the InGaN to have a composition of $In_xGa_{(1-x)}N$, wherein x is at least about 0.05, comprises formulating the InGaN to have a composition of $In_xGa_{(1-x)}N$, wherein x is between about 0.05 and about 0.10.

10. The method of claim 1, wherein epitaxially growing the InGaN further comprises limiting a size of V-pits in the InGaN to an average pit width of about two hundred nanometers (200 nm) or less.

11. The method of claim 10, wherein limiting the size of V-pits in the InGaN to the average pit width of about two hundred nanometers (200 nm) or less comprises limiting the size of V-pits in the InGaN to an average pit width of about one hundred and fifty nanometers (150 nm) or less.

12. The method of claim 1, further comprising selecting the nitrogen precursor to comprise ammonia.

13. The method of claim 1, further comprising selecting the one or more Group III precursors to comprise trimethylindium and triethylgallium.

14. A method of forming a ternary III-nitride material, comprising:
  providing a precursor gas mixture within a chamber and formulating the precursor gas mixture to comprise a nitrogen precursor and two or more Group III precursors;
  causing a ratio of a partial pressure of the nitrogen precursor to a partial pressure of the two or more Group III precursors within the chamber to be at least about 5,600;
  decomposing the nitrogen precursor and the two or more Group III precursors in the chamber to form elemental nitrogen and two or more Group III elements within the chamber; and
  epitaxially growing the ternary III-nitride material over a substrate within the chamber from the elemental nitrogen and the two or more Group III elements.

15. The method of claim 14, wherein epitaxially growing the ternary III-nitride material over the substrate comprises growing the ternary III-nitride material on a binary III-nitride material.

16. The method of claim 15, further comprising formulating the ternary III-nitride material such that a relaxed lattice parameter mismatch between the ternary III-nitride material and the binary III-nitride material is at least about 0.5% of the relaxed average lattice parameter of the binary III-nitride material.

17. The method of claim 16, wherein epitaxially growing the ternary III-nitride material over the substrate comprises growing a layer of the ternary III-nitride having an average layer thickness of at least about two hundred nanometers (200 nm).

18. The method of claim 17, wherein epitaxially growing the ternary III-nitride material further comprises limiting a size of V-pits in the ternary III-nitride material to an average pit width of about two hundred nanometers (200 nm) or less.

19. The method of claim 14, wherein causing the ratio of the partial pressure of the nitrogen precursor to the partial pressure of the two or more Group III precursors within the chamber to be at least about 5,600 comprises causing the ratio to be in a range extending from 5,600 to 6,600.

* * * * *